United States Patent
Lynam

(10) Patent No.: US 10,742,254 B1
(45) Date of Patent: Aug. 11, 2020

(54) METHOD AND APPARATUS FOR A TRANSCEIVER SYSTEM

(71) Applicant: Xilinx, Inc., San Jose, CA (US)

(72) Inventor: Adrian Lynam, Ashbourne (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/056,236

(22) Filed: Aug. 6, 2018

(51) Int. Cl.
| | | |
|---|---|---|
| *H04B 1/525* | (2015.01) | |
| *H03M 1/10* | (2006.01) | |
| *H03M 1/00* | (2006.01) | |
| *H04B 1/04* | (2006.01) | |

(52) U.S. Cl.
CPC ............ *H04B 1/525* (2013.01); *H03M 1/004* (2013.01); *H03M 1/1033* (2013.01); *H04B 1/0475* (2013.01)

(58) Field of Classification Search
CPC ... H04B 1/525; H04B 1/0475; H03M 1/1033; H03M 1/004
See application file for complete search history.

(56) References Cited

U.S. PATENT DOCUMENTS

| | | | | |
|---|---|---|---|---|
| 2009/0325509 | A1* | 12/2009 | Mattisson | H04B 1/525 455/75 |
| 2012/0155572 | A1* | 6/2012 | Kim | H03F 1/3247 375/297 |
| 2013/0294462 | A1* | 11/2013 | Chang | H04J 1/045 370/497 |
| 2014/0194071 | A1* | 7/2014 | Wyville | H04B 1/525 455/73 |
| 2016/0294437 | A1* | 10/2016 | Alavi | H04B 1/525 |
| 2018/0167093 | A1* | 6/2018 | Miyazaki | H03F 1/3247 |

OTHER PUBLICATIONS

Frotzscher, Andreas et al., Least Squares Estimation for the Digital Compensation of TX Leakage in Zero-IF Receivers, 2009 IEEE Global Telecommunications Conference, Nov. 30, 2009, pp. 1-6, IEEE, Piscataway, New Jersey, USA.
Kiayani, Adnan et al., "Adaptive Nonlinear RF Cancellation for Improved Isolation in Simultaneous Transmit-Receive Systems," arXiv:1709.06073v1 [eess.SP], Aug. 16, 2017, pp. 1-10, Cornell University Library, Ithaca, New York, USA.

* cited by examiner

*Primary Examiner* — Lewis G West
(74) *Attorney, Agent, or Firm* — Haynes and Boone, LLP

(57) ABSTRACT

A leakage compensation circuit includes a compensation digital to analog converter (DAC) and an adjustment circuit. The compensation DAC is configured to: receive a first digital signal associated with a transmitter of a transceiver; generate a compensation analog signal using the first digital signal; and provide the compensation analog signal to a receiver of the transceiver. The adjustment circuit is configured to generate the first digital signal by adjusting a second digital signal from the transmitter based on one or more adjustment parameters.

20 Claims, 8 Drawing Sheets

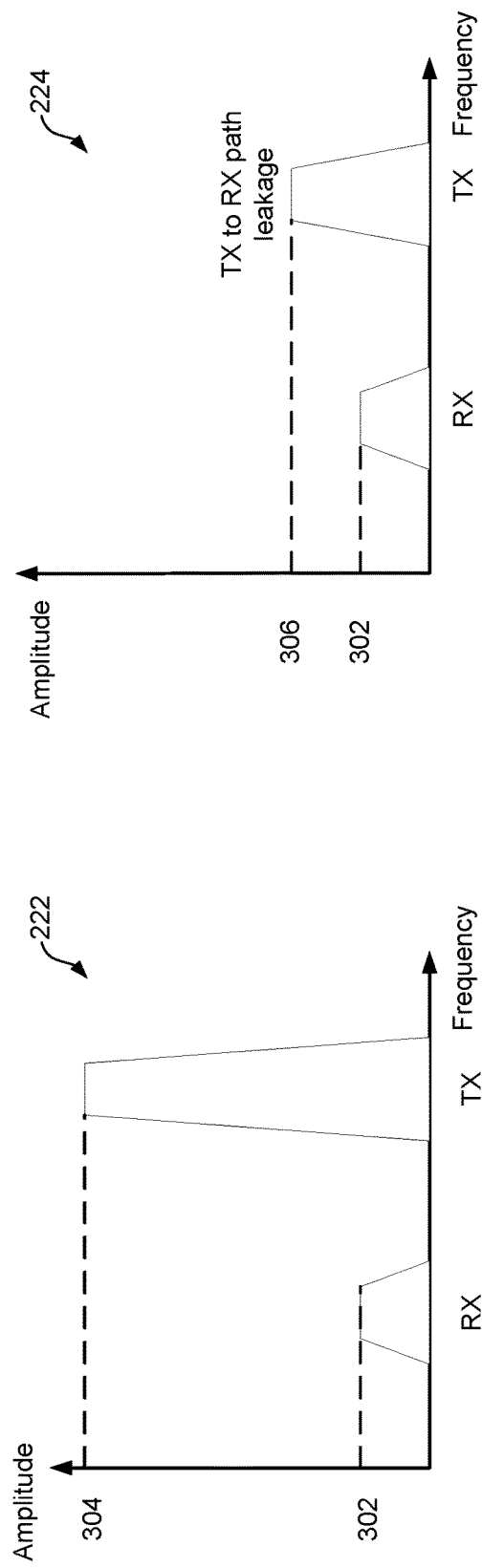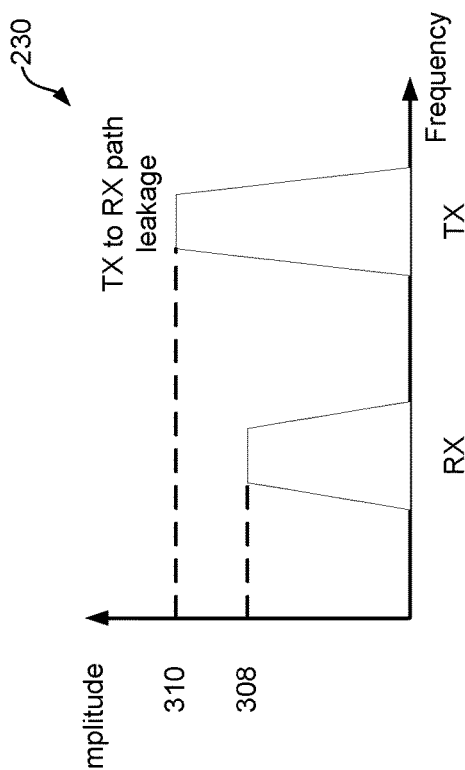

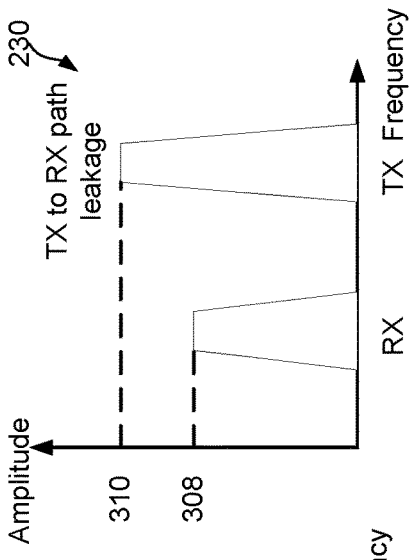
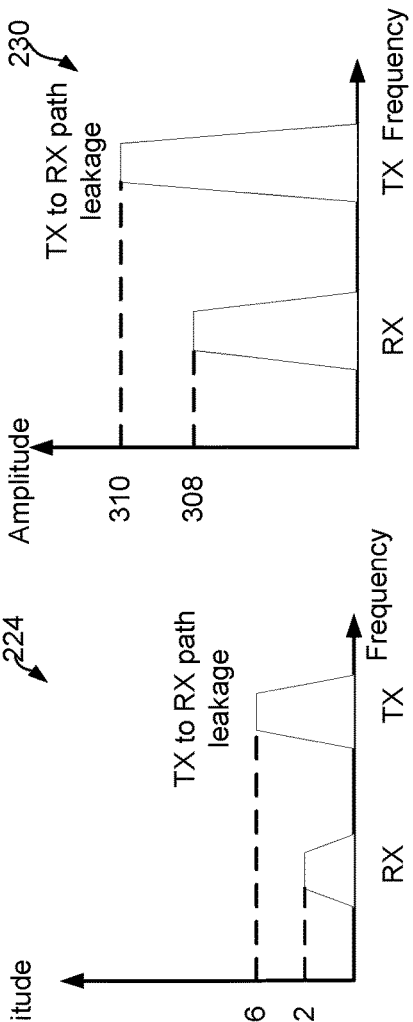
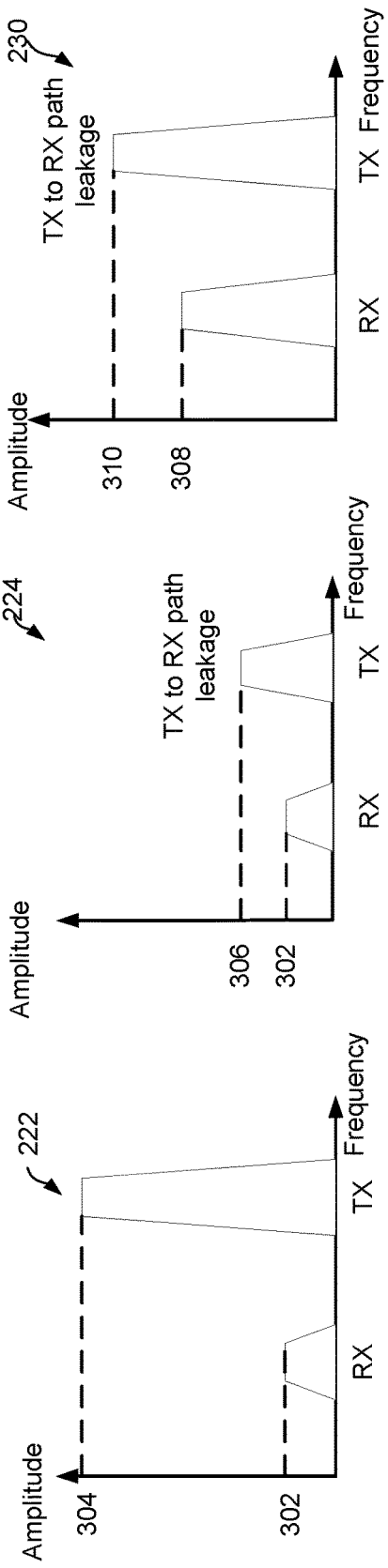
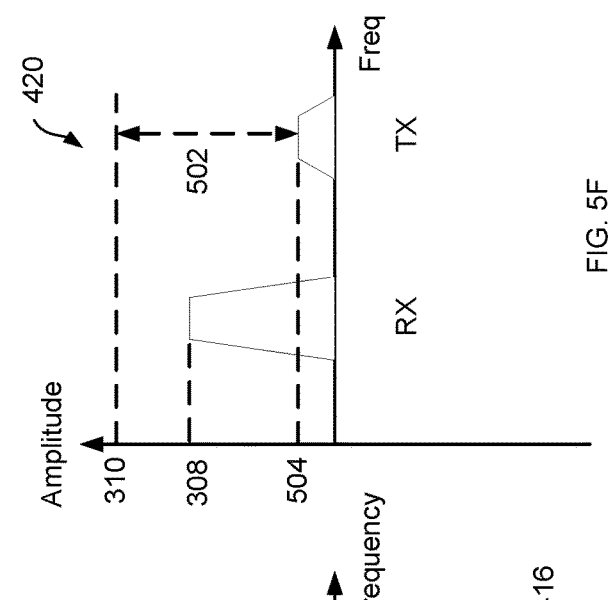
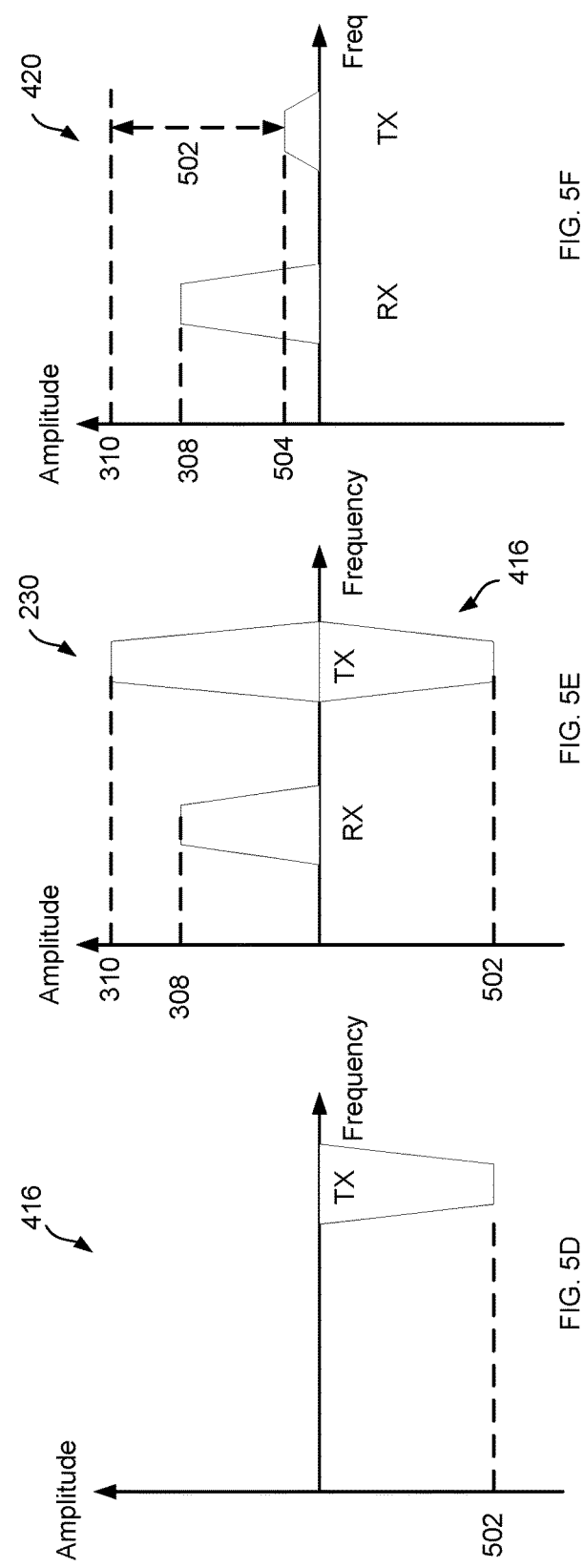

METHOD AND APPARATUS FOR A TRANSCEIVER SYSTEM

TECHNICAL FIELD

Examples of the present disclosure generally relate to integrated circuits ("ICs") and, in particular, to an embodiment related to compensation for transmitter (TX) to receiver (RX) path leakage in a transceiver system.

BACKGROUND

In many wireless or wired devices supporting simultaneous transmission and reception, the coupling of the transmit signal into the receiver is one key technical challenge. For example, in transceivers operating in frequency division duplex (FDD) or full duplex (FDX) mode, a transmitter (TX) leakage signal may be present at the receiver (RX) input due to the limited isolation of the transmission medium and/or duplexer that permits the TX and RX to share a common antenna. This may impose challenging linearity requirements for the RX front-end components.

Accordingly, it would be desirable and useful to provide an improved method and system for TX leakage compensation in a transceiver.

SUMMARY

In some embodiments, a leakage compensation circuit includes a compensation digital to analog converter (DAC) and an adjustment circuit. The compensation DAC is configured to: receive a first digital signal associated with a transmitter of a transceiver; generate a compensation analog signal using the first digital signal; and provide the compensation analog signal to a receiver of the transceiver. The adjustment circuit is configured to: generate the first digital signal by adjusting a second digital signal from the transmitter based on one or more adjustment parameters.

In some embodiments, the adjustment circuit includes an amplitude scaling circuit configured to: adjust an amplitude of the second digital signal based on an amplitude scaling parameter of the adjustment parameters such that an amplitude of the first digital signal is aligned with an amplitude of a transmitter leakage signal in the receiver.

In some embodiments, the adjustment circuit includes a phase alignment circuit configured to: adjust a phase of the second digital signal based on a phase alignment parameter of the adjustment parameters such that a phase of the first digital signal is aligned with a phase of a transmitter leakage signal in the receiver.

In some embodiments, the leakage compensation circuit includes a control circuit configured to perform a calibration process to determine values of the one or more adjustment parameters.

In some embodiments, the leakage compensation circuit includes a control circuit configured to update the one or more adjustment parameters based on a feedback signal from the receiver.

In some embodiments, the compensation DAC is configured to provide the compensation analog signal to a combiner circuit, wherein the combiner circuit is configured to adjust a first analog signal in the receiver with the compensation analog signal to provide a second analog signal to an input of a first device in the receiver.

In some embodiments, the first device is one of an analog to digital converter (ADC) or a low-noise amplifier (LNA) in the receiver.

In some embodiments, the compensation analog signal is used to remove direct current (DC) offsets in the receiver.

In some embodiments, a leakage compensation system includes a compensation digital to analog converter (DAC) configured to: receive a first digital signal associated with a transmitter of a transceiver; generate a compensation analog signal using the first digital signal; and provide the compensation analog signal to adjust a first input signal of an analog to digital converter (ADC) of a receiver of the transceiver.

In some embodiments, the leakage compensation system includes a combiner circuit configured to adjust the first input signal with the compensation analog signal and provide the adjusted first input signal to the ADC.

In some embodiments, the compensation DAC and the ADC are located in a same integrated circuit (IC).

In some embodiments, the leakage compensation system includes an adjustment circuit configured to: generate the first digital signal by adjusting a second digital signal from the transmitter based on one or more adjustment parameters.

In some embodiments, the leakage compensation system includes a control circuit configured to perform a calibration process to determine values of the one or more adjustment parameters.

In some embodiments, the leakage compensation system includes a control circuit configured to: update the one or more adjustment parameters based on a feedback signal from the receiver.

In some embodiments, a method includes receiving a first digital signal associated with a transmitter of a transceiver; generating a compensation analog signal using the first digital signal; and providing the compensation analog signal to adjust a first input signal of an analog to digital converter (ADC) of a receiver of the transceiver.

In some embodiments, the method includes generating the first digital signal by adjusting a second digital signal from the transmitter based on one or more adjustment parameters.

In some embodiments, the generating the first digital signal includes: adjusting an amplitude of the second digital signal using an amplitude scaling parameter of the adjustment parameters such that an amplitude of the first digital signal is aligned with an amplitude of a transmitter leakage signal of the first input signal.

In some embodiments, the generating the first digital signal includes: adjusting a phase of the second digital signal based on a phase alignment parameter of the adjustment parameters such that a phase of the first digital signal is aligned with a phase of a transmitter leakage signal of the first input signal.

In some embodiments, the compensation DAC is in a first integrated circuit (IC), and the ADC is in a second IC.

Other aspects and features will be evident from reading the following detailed description and accompanying drawings.

BRIEF DESCRIPTION OF THE DRAWINGS

FIGS. 3A, 3B, and 3C are diagrams illustrating TX to RX path leakage of the transceiver of FIG. 2 according to some embodiments of the present disclosure.

FIGS. 5A, 5B, 5C, 5D, 5E, and 5F are diagrams illustrating TX to RX path leakage compensation in the transceiver of FIG. 4A according to some embodiments of the present disclosure.

DETAILED DESCRIPTION

Figure 1:
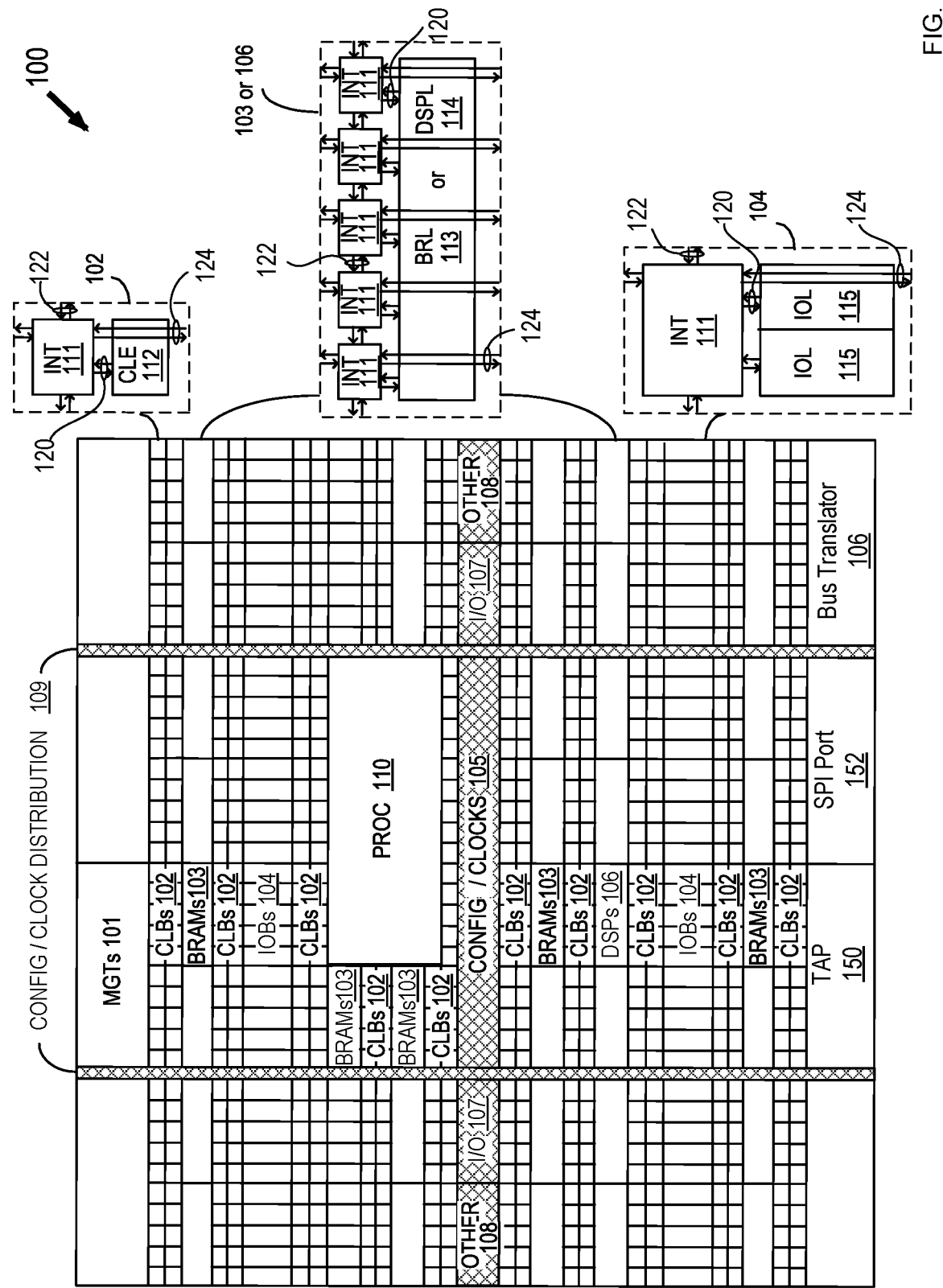
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, in a typical transceiver that permits its TX and RX to share a common antenna, a TX leakage signal may be present at the RX input because of the limited isolation of a duplexer coupled to the common antenna. Such a TX to RX path leakage signal (also referred to as a TX leakage signal) may limit the receiver sensitivity because it limits the low-noise amplifier (LNA) gain in the RX path, especially when the TX leakage signal has an amplitude much greater than the amplitude of the desired receiver signal. In some examples, compensation solutions with digital techniques are used to improve the isolation between the TX and RX. However, those compensation solutions may not prevent saturation of the ADC and/or LNA in the analog path of the receiver. In another example, analog compensation at the LNA input is used. However, in that example, many additional resources (e.g., additional components, printed circuit board (PCB) resources, DSP resources) may be required.

For integrated circuit (IC) solutions, it has been discovered that by compensating the TX to RX path leakage in the analog domain at an input of the ADC of the receiver, larger LNA gain settings, and improved receiver sensitivity may be achieved.

Various advantages may be present in various applications of the present disclosure. No particular advantage is required for all embodiments, and different embodiments may offer different advantages. One of the advantages of some embodiments is that by compensating the TX to RX path leakage at an input of the ADC of the receiver, saturation of the ADC is prevented while a high LNA gain is maintained. Another of the advantages of some embodiments is that by using a compensation DAC that has a better linearity and noise performance than the ADC of the receiver, the compensation DAC output provided to the ADC input has little or no impact on the receiver's noise or linearity. Yet another of the advantages of some embodiments is that by using a current steering compensation DAC output, applying the current steering compensation DAC output at an input of a current mode ADC of the receiver may be achieved by a combiner using limited resources (e.g., by using a Wilkinson power combiner implemented on the PCB with a resistor). Yet another of the advantages of some embodiments is that by reducing the TX-RX isolation requirement, thereby relaxing the in-band RX filtering requirements. Yet another of the advantages of some embodiments is that the TX leakage compensation system is highly selective in its correction of the TX leakage signal in the receiver. Yet another of the advantages of some embodiments is that compensation DAC output may be used for removal of harmful direct current (DC) offsets or local oscillator (LO) leakage suppression in the receiver.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more embodiments described herein is not limited to the exemplary IC depicted in FIG. 1, and that IC having other configurations, or other types of IC, may also implement those embodiments.

Figure 2:
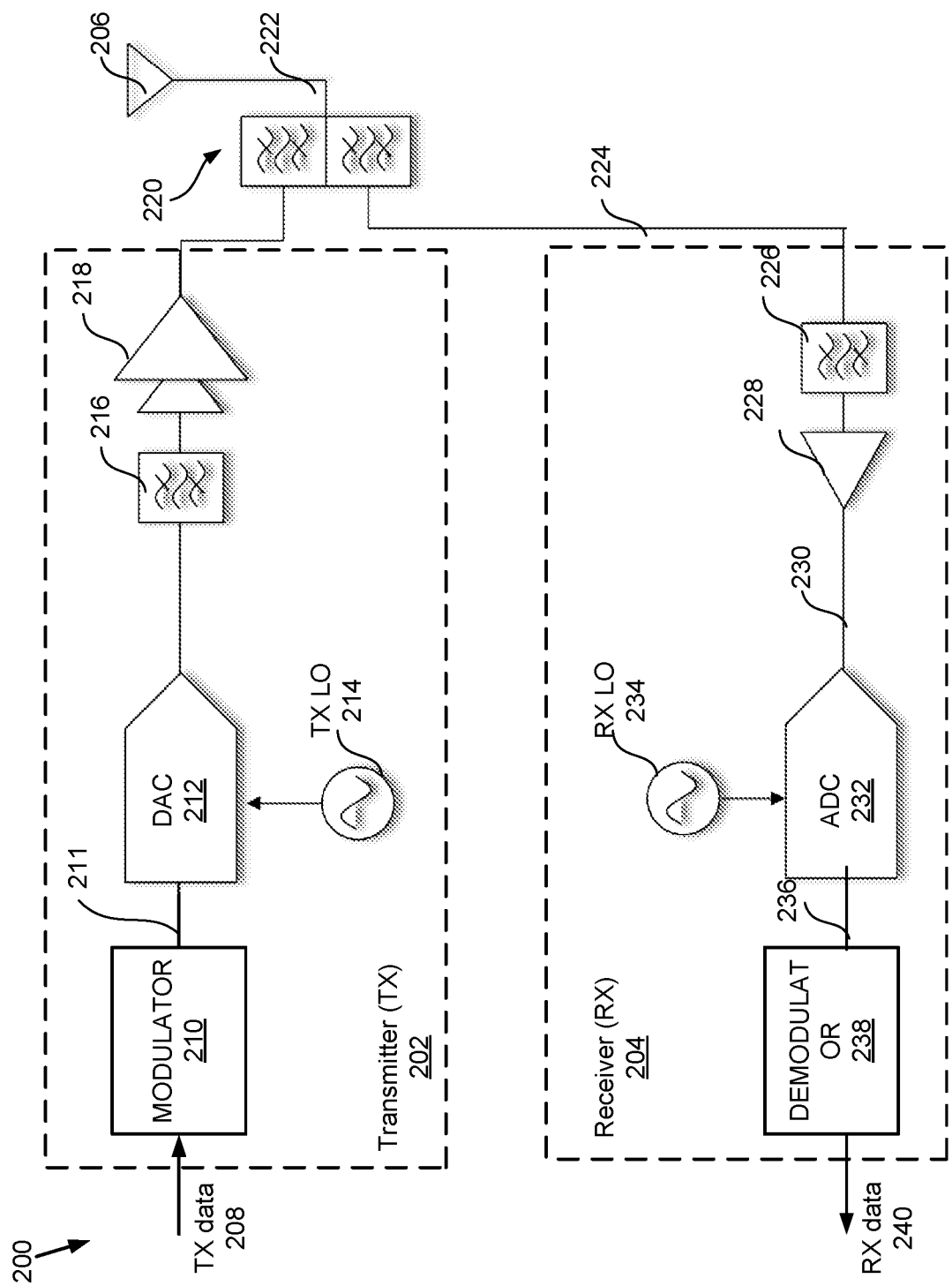
FIG. 2 is a block diagram illustrating a transceiver according to some embodiments of the present disclosure.

Referring to FIG. 2, illustrated is a transceiver 200. The transceiver 200 includes a transmitter 202 and a receiver 204 sharing a common antenna 206 through a duplexer 220. The duplexer 220 allows bi-directional communication through the antenna 206 over a signal path 222, and isolates the receiver 204 from the transmitter 202 while permitting them to share a common antenna 206.

In the example of FIG. 2, the transmitter 202 includes a modulator 210 that receives TX data 208 and generates a digital signal 211. A DAC 212 may receive the digital signal 211, and sample the digital signal 211 (e.g., using a clock signal from a TX local oscillator 214). The DAC 212 may convert those samples to an analog signal 215. The analog signal 215 may then be sent to a band pass filter (BPF) 216, which provides a filtered analog signal to a power amplifier 218. The power amplifier 218 may amplify the filtered analog signal, and provide an amplified analog signal to the antenna 206 through the duplexer 220 for transmission.

In the example of FIG. 2, the receiver 204 receives an analog signal 224 through the duplexer 220 from the antenna 206. The analog signal 224 is sent to a BPF 226 to generate a filtered analog signal. The filtered analog signal is sent a low noise amplifier (LNA) 228 to generate an amplified analog signal 230. An ADC 232 receives the amplified analog signal 230, and generates a digital signal 236 (e.g., using a clock signal from RX local oscillator 234). A demodulator 238 may perform demodulation to the digital signal 236, and output the demodulated RX data 240.

Referring to FIGS. 3A, 3B, and 3C, in various embodiments, a TX leakage signal may be present at the receiver (RX) input (e.g., because of the limited isolation of the duplexer 220 and/or limited isolation of the transmission medium preceding the PA). Referring to the example of FIG. 3A, signal path 222 between the duplexer 220 and the antenna 206 may include RX data (e.g., at the RX frequency) having amplitude 302. Further, signal path 222 includes TX data (e.g., at the TX frequency) having amplitude 304. Amplitude 304 of the TX data may be much greater (e.g., by more than 100 dB) than amplitude 302 of the RX data received concurrently.

Referring to the example of FIG. 3B, because of the isolation limit of the duplexer 220, a TX leakage signal is present at the input signal 224 of the receiver 204. For example, the duplexer 220 may have a TX/RX isolation between about 40 dB and 70 dB. As shown in FIG. 3B, the input signal 224 of the receiver 204 includes an RX signal having amplitude 302, and a TX leakage signal with an amplitude 306. In the example of FIG. 3B amplitude 306 of the TX leakage signal in signal 224 is greater than amplitude 302 of the RX signal of the input signal 224. In alternative examples, the amplitude 306 of the TX leakage signal in signal 224 may be less than the amplitude 302 of the RX signal of the input signal 224.

Referring to the example of FIG. 3C, the TX leakage signal in signal 224 may be amplified by the LNA 228 and presented in signal 230 at an input of the ADC 232. In the example of FIG. 3C, in signal 224, the RX signal has amplitude 308 greater than amplitude 302 of FIGS. 3A and 3B, while the TX leakage signal has amplitude 310 greater than amplitude 306 of FIG. 3B.

Figure 4A:
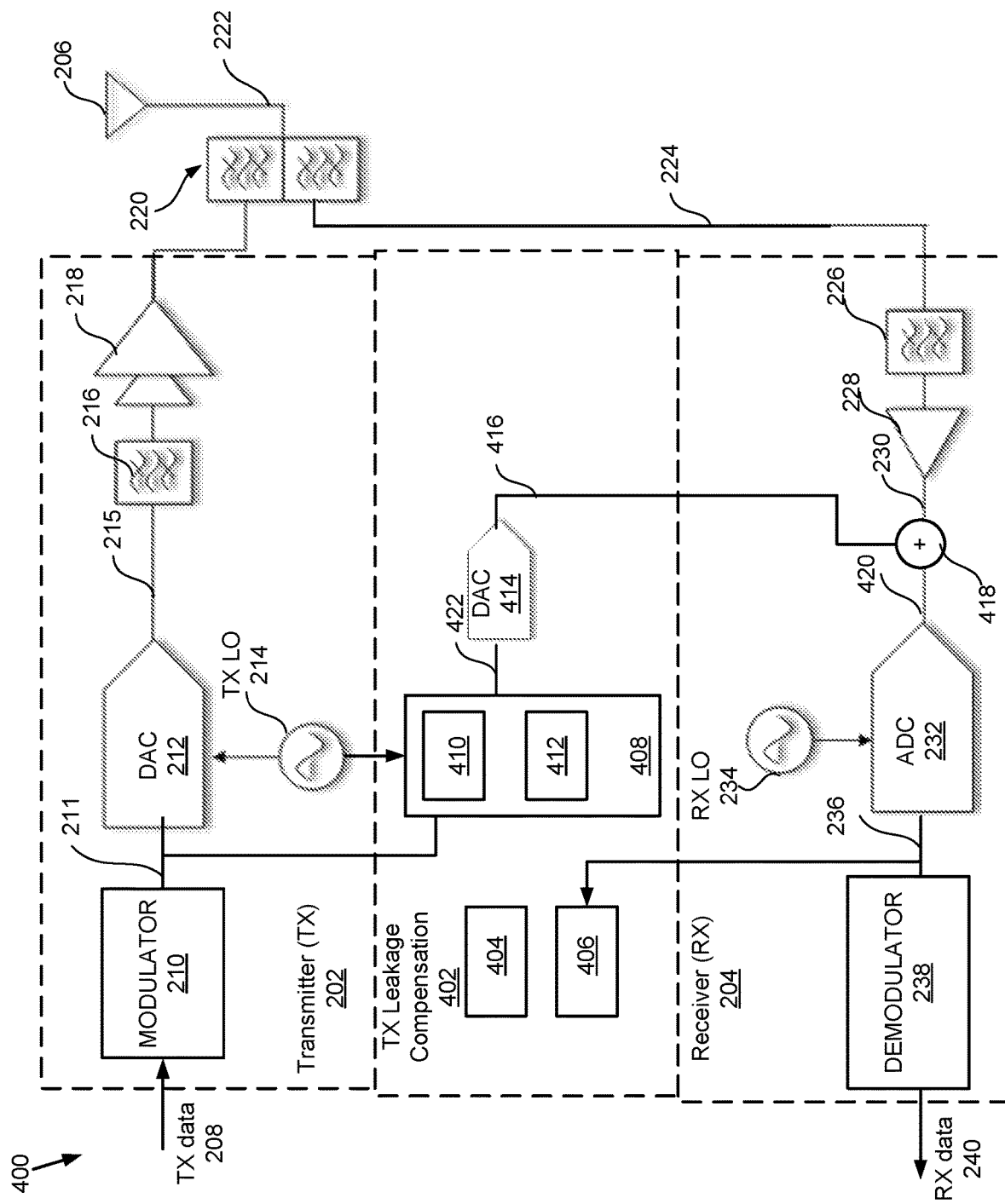
FIG. 4A is a block diagram illustrating a transceiver including a leakage compensation system according to some embodiments of the present disclosure.
Figure 4B:
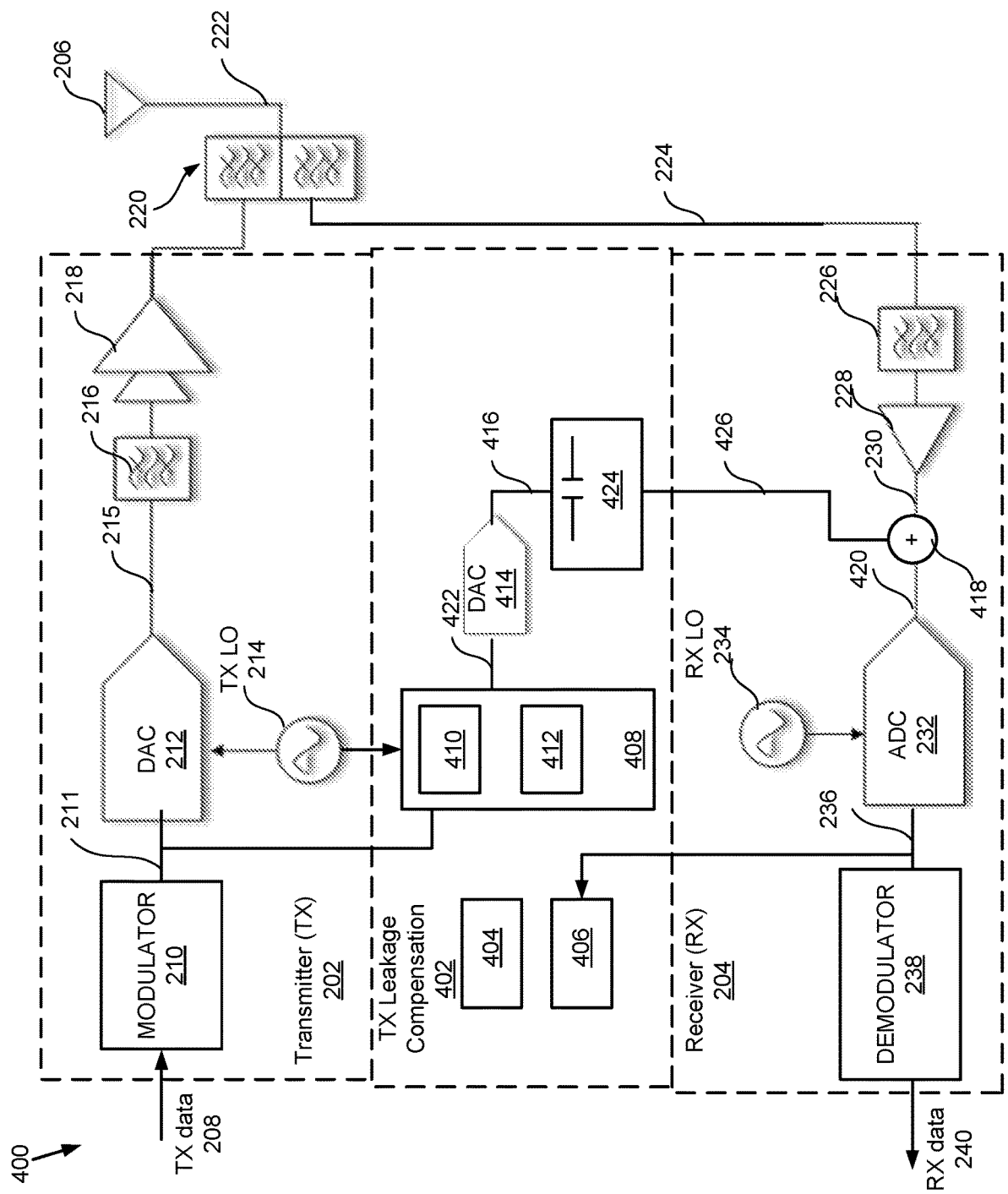
FIG. 4B is a block diagram illustrating a transceiver including another leakage compensation system according to some embodiments of the present disclosure.
Figure 6:
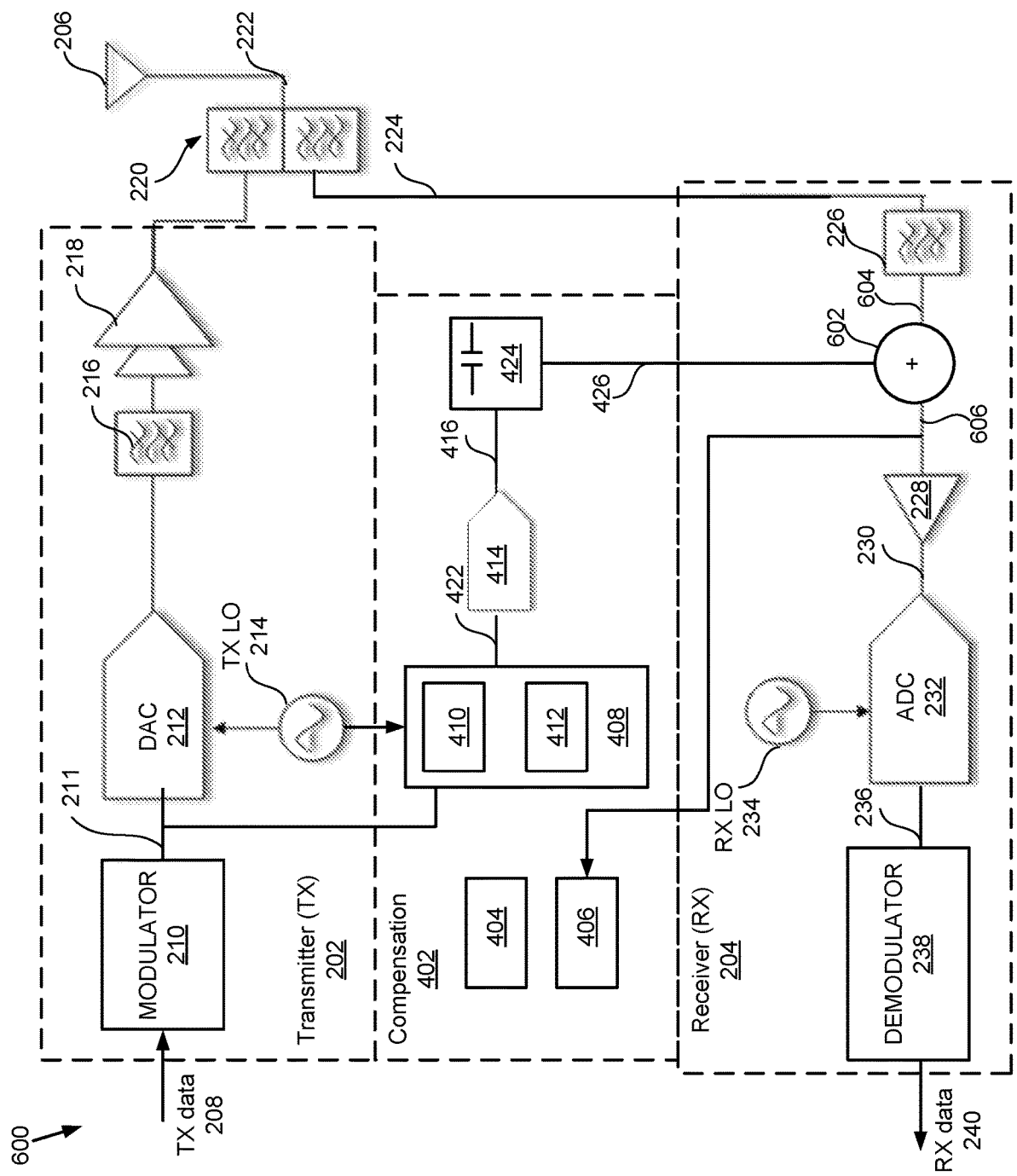
FIG. 6 is a block diagram illustrating a transceiver including a TX to RX path leakage compensation system according to some embodiments of the present disclosure.
Figure 7:
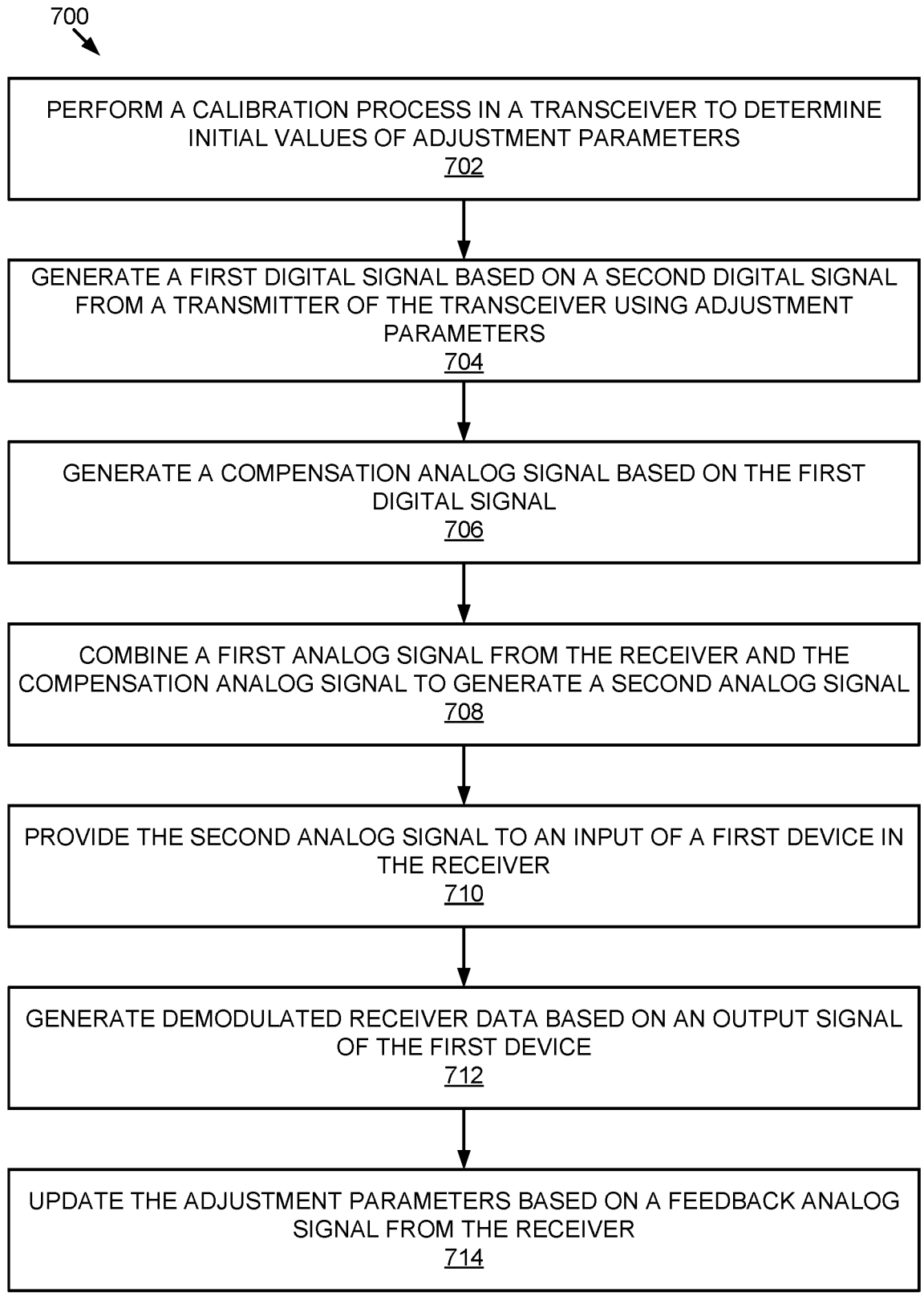
FIG. 7 is a flow diagram illustrating an exemplary method for TX to RX path leakage compensation according to some embodiments of the present disclosure.

Referring to FIGS. 4A-4B, 5A-5F, 6, and 7, systems and methods for compensating the TX to RX path leakage in the analog domain of a transceiver are described. FIGS. 4A and 4B illustrate examples of a TX leakage compensation circuit 402 (also referred to as a compensation circuit 402) for compensating the TX leakage signal at an input of an ADC of the receiver. FIGS. 5A-5F illustrate the reduction of the TX leakage signal at the input of the ADC of the receiver by using the compensation circuit 402 of FIG. 4A. FIG. 6 illustrates an example of a compensation circuit 402 for compensating the TX leakage signal at an input of an LNA of the receiver. FIG. 7 illustrates a method for compensating the TX to RX path leakage in a transceiver.

Referring to the example of FIG. 4A, a transceiver system 400 is illustrated. The transceiver system 400 is substantially similar to the transceiver system 200 of FIG. 2 except the differences described below. The transceiver system 400 includes a compensation circuit 402 for TX to RX path leakage compensation.

In the example of FIG. 4A, an adjustment circuit 408 of the compensation circuit 402 receives a digital signal 211 from an input of the DAC 212 of the transmitter 202, and generates an adjusted digital signal 422. The adjustment circuit 408 may receive adjustment parameters (e.g., amplitude scaling parameter, phase alignment parameter, other suitable adjustment parameter, and/or a combination thereof) from a storage device 404 and/or a controller 406, and generates the adjusted digital signal 422 based on the adjustment parameters. In an example, the amplitude of the adjusted digital signal 422 may align with on the amplitude of the TX leakage signal. In another example, the phase of the adjusted digital signal 422 may align with the phase of the TX leakage signal. In an example where the modulator 210 performs quadrature amplitude modulation (QAM), the adjustment circuit 408 may perform both amplitude scaling and phase alignment to the digital signal 211 generate the adjusted digital signal 422. In some embodiments, systematic amplitude or phase errors may be calibrated using a separate calibration process (e.g., as described in detail at block 702 of FIG. 7) controlled by a calibration signal. In some embodiments, background continuous calibration may be performed by correlation of the transmitted and received signals to adjust the parameters to reduce the leakage.

In some embodiments, a calibration process is performed to the transceiver 400 to determine the TX to RX path leakage. The calibration process may determine one or more adjustment parameters based on the TX to RX path leakage (e.g., using either training signals or online TX data transmitted in the transceiver 400). The determined adjustment parameters may be saved in the storage device 404. The adjustment circuit 408 may then receive the adjustment parameters from the storage device 404 for online leakage compensation.

In some embodiments, a controller 406 may receive a receiver feedback signal (e.g., a digital signal 236 from the output of the ADC 232) from the receiver 204, and dynamically update the adjustment parameters in real time based on the receiver feedback signal. The updated adjustment parameters may then be sent to the storage device 404 and/or the adjustment circuit 408.

In some embodiments, the adjustment circuit 408 includes an amplitude scaling circuit 410 and a phase alignment circuit 412. The amplitude scaling circuit 410 may adjust the amplitude of the received digital signal 211 to generate the adjusted digital signal 422 based on the amplitude scaling parameter. In other words, the amplitude of the adjusted digital signal 422 may be determined based on the amplitude scaling parameter. In an example, the amplitude scaling parameter may be determined based on the TX to RX path leakage.

In some embodiments, the phase alignment circuit 412 may adjust the phase of the received TX signal 211 to generate the adjusted digital signal 422. In other words, the phase of the adjusted digital signal 422 may be determined based on the phase alignment parameter. In an example, the phase alignment parameter provides a 180-degree phase shift. In that example, the 180-degree phase shift may be achieved by inversion of the differential ends of the digital signal 211. In an example, such inversion may be performed in the phase alignment circuit 412 such that the adjusted digital signal 422 has the shifted phase. In another example, such inversion may be performed to a compensation analog signal 416 at a combiner 418.

In some embodiments, a compensation DAC 414 receives the adjusted digital signal 422, and generates a compensation analog signal 416 (e.g., using a clock signal from TX local oscillator 214).

In some embodiments, the compensation analog signal 416 is provided to a combiner 418, which combines the compensation analog signal 416 with the amplified analog signal 230 from the LNA 228. In an example (e.g., where DAC 414 and ADC 232 are voltage compliant), the compensation analog signal 416 is used for removal of harmful direct current (DC) offsets or local oscillator (LO) leakage suppression in the receiver 204 (e.g., a direct down conversion receiver).

In an example, the combiner 418 includes a Wilkinson power combiner (e.g., implemented on the PCB with a resistor). In an example where the input of the ADC 232 is a current mode input, the combiner 418 sums currents of the compensation analog signal 416 and amplified analog signal 230 to generate an ADC input signal 420. The compensated ADC input signal 420 is then provided to the input of the ADC 232. Because the leakage compensation is performed prior to an input buffer of the ADC 232, it prevents ADC input buffer saturation.

Referring to FIG. 4B, another example of a transceiver including a leakage compensation system is illustrated. The transceiver 450 of FIG. 4B is substantially similar to the transceiver 400 of FIG. 4A except the differences described below. In the example of FIG. 4B, the compensation analog signal 416 is sent to an alternating current (AC) coupling circuit 424, which performs AC coupling to the signal 416 and generates a compensation analog signal 426 that is an AC signal. The AC coupling circuit 424 includes one or more coupling capacitors. By using an AC signal 426, DC compliance issues may be avoided.

Referring to FIGS. 5A, 5B, 5C, 5D, 5E, and 5F, the TX to RX path leakage is compensated at the input of the ADC of the receiver by using the TX leakage compensation circuit 402 of FIG. 4A. FIGS. 5A, 5B, and 5C illustrate the RX signal and TX leakage signal in signals 222, 224, and 230 of the transceiver 400 of FIG. 4A respectively, which are substantially similar to those described above with reference to FIGS. 3A, 3B, and 3C. As shown in FIG. 5D, the compensation analog signal 416 generated by the compensation circuit 402 includes a TX compensation signal at the TX frequency with amplitude 502. That TX compensation signal has a phase of 180 degrees relative to the TX leakage signal in the signal 230.

Referring to the examples of FIG. 5E, the compensation analog signal 416 and the LNA output signal 230 are combined by the combiner 418 to generate the compensated ADC input signal 420. As shown in FIG. 5F, by using the compensation circuit 402, a TX leakage signal in the compensated ADC input signal 420 has an amplitude 504 that is less than the amplitude 310 of the TX leakage signal in the signal 230 (e.g., by amplitude 502).

Referring to the example of FIG. 6, in some embodiments, the compensation circuit 402 may provide the compensation analog signal 426 to an input of the LNA of the receiver 204. The transceiver system 600 of FIG. 6 is substantially similar to the transceiver system 400 of FIG. 4A except the differences described below. Unlike the transceiver system 400 of FIG. 4A where a combiner 418 is located at an input of the ADC 232, in transceiver system 600, a combiner 602 is located at an input of the LNA 228. For example, the compensation circuit 402 may provide the compensation analog signal 426 to the combiner 602, which combines the compensation analog signal 426 with a filtered signal 604 from the BPF 226, and generate a compensated LNA input signal 606 by compensating the TX leakage signal in the filtered signal 604 using the compensation analog signal 426. The compensated LNA input signal 606 may then be provided to an input of the LNA 228. In an example, the combiner 602 includes a Wilkinson power combiner (e.g., implemented on the PCB with a resistor). In some embodiments, because of the nonlinearity of the power amplifier 218, performing the compensation at the input of the LNA 228 as shown in FIG. 6 may use more hardware and/or DSP resources than performing the compensation at the input of the ADC 232 as shown in FIG. 4A.

Referring to the example of FIG. 7, a method 700 for compensating TX to RX path leakage in a transceiver is illustrated. The method 700 begins at block 702, where a calibration process is performed to determine initial values of adjustment parameters for a TX leakage compensation circuit of a transceiver. In the example of FIG. 4A, a controller 406 may perform a calibration process (e.g., using training transmitter data or online transmitter data) to determine the initial value of adjustment parameters for the compensation circuit 402. Those initial values may be stored in a storage device 404.

The method 700 may proceed to block 704, where a compensation signal (e.g., a first digital signal 422) is generated based on the transmitted signal (e.g., a second digital signal 211) from a transmitter of the transceiver denoted as "the second" digital signal. In the example of FIG. 4A, an adjustment circuit 408 may generate a first digital signal 422 based on a second digital signal 211 from a transmitter 202 of the transceiver 400. The second digital signal 211 may be an output signal of a DAC 212 of the transmitter 202.

In some embodiments, at block 704, the adjustment circuit 408 adjusts the second digital signal 211 using adjustment parameters (e.g., from the storage device 404) to generate the first digital signal 422. For example, an amplitude scaling circuit 410 may adjust an amplitude of the digital signal 211 using an amplitude scaling parameter such that an amplitude of the first digital signal 422 is aligned with an amplitude of a transmitter leakage signal (e.g., a transmitter leakage signal in the LNA output signal 230). For further example, a phase alignment circuit 412 may adjust a phase of the digital signal 211 based on a phase alignment parameter, such that a phase of the first digital signal 422 is aligned with a phase of the transmitter leakage signal (e.g., a transmitter leakage signal in the LNA output signal 230).

The method 700 may proceed to block 706, where a compensation analog signal is generated based on the first digital signal. In the example of FIG. 4A, a compensation DAC 414 receives the first digital signal 422, and generates a compensation analog signal 416 based on the first digital signal 422 (e.g., using a clock signal provided by TX local oscillator 214). In an example, at block 706, the compensation DAC 414 uses an AC coupling circuit 424 to generate a compensation analog signal 426.

The method 700 may proceed to block 708, where a first analog signal from the receiver is combined with the compensation analog signal to generate a second analog signal. In the example of FIG. 4A, a combiner 418 combines an analog signal 230 from the LNA 228 and a compensation analog signal 416, and generates an analog signal 420. In the example of FIG. 6, a combiner 602 combines an analog signal 604 from the BPF 226 and a compensation analog signal 426, and generates an analog signal 606.

The method 700 may proceed to block 710, where the second analog signal is provided to an input of a device in the receiver. In the example of FIG. 4A, the second analog signal 420 is provided by the combiner 418 to an input of an ADC 232 in the receiver 204. In the example of FIG. 6, the second analog signal 606 is provided by the combiner 602 to an input of an LNA 228 in the receiver 204. It is noted while ADC 232 and LNA 228 are used as examples of the device for receiving the second analog signal, the second analog signal may be provided to an input of any device in the receiver 204.

The method 700 may proceed to block 712, where demodulated receiver data is generated based on an output signal of the first device in the receiver. In the example of FIG. 4A, a demodulator 238 generates demodulated RX data 240 based on an output of the ADC 232. In the example of FIG. 6, an output signal 230 of the LNA 228 is sent to an ADC 232 and a demodulator 238, which generates demodulated RX data 240 based on the output signal 230.

The method 700 may proceed to block 714, where the adjustment parameters are updated based on a feedback signal from the receiver. In the example of FIG. 4A, a controller 406 receives a feedback signal (e.g., an output signal 236 from the ADC 232) from the receiver 204, and updates the adjustment parameters based on the feedback signal 420. In the example of FIG. 6, a controller 406 receives a feedback analog signal 606 (e.g., an input signal to the LNA 228) from the receiver 204, and updates the adjustment parameters based on the feedback analog signal 606.

It is noted that various configurations illustrated in FIGS. 2 to 7 are exemplary only and not intended to be limiting beyond what is specifically recited in the claims that follow. It will be understood by those skilled in that art that other configurations may be used. In an example, the DAC 212, DAC 414, and ADC 232 may be located in separate ICs respectively. In another example, two or three of the DAC 212, DAC 414, and ADC 232 may be located in the same IC. One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device, The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A leakage compensation circuit, comprising:
  a compensation digital to analog converter (DAC) configured to:
    receive a compensation digital signal based on a transmission digital signal from a transmitter of a transceiver,
      wherein the transmission digital signal is provided to a transmitter DAC of the transmitter;
    provide a compensation analog signal based on the compensation digital signal to a receiver of the transceiver; and an adjustment circuit configured to:
   generate the compensation digital signal by adjusting the transmission digital signal from the transmitter based on one or more adjustment parameters.

2. The leakage compensation circuit of claim 1, wherein the adjustment circuit includes an amplitude scaling circuit configured to:
   adjust an amplitude of the transmission digital signal based on an amplitude scaling parameter of the adjustment parameters such that an amplitude of the compensation digital signal is aligned with an amplitude of a transmitter leakage signal in the receiver.

3. The leakage compensation circuit of claim 1, wherein the adjustment circuit includes a phase alignment circuit configured to:
   adjust a phase of the transmission digital signal based on a phase alignment parameter of the adjustment parameters such that a phase of the compensation digital signal is aligned with a phase of a transmitter leakage signal in the receiver.

4. The leakage compensation circuit of claim 1, further comprising:
   a control circuit configured to perform a calibration process to determine values of the one or more adjustment parameters.

5. The leakage compensation circuit of claim 1, further comprising:
   a control circuit configured to:
     update the one or more adjustment parameters based on a feedback signal from the receiver.

6. The leakage compensation circuit of claim 1, wherein the compensation DAC is configured to provide the compensation analog signal to a combiner circuit,
   wherein the combiner circuit is configured to adjust a first analog signal in the receiver with the compensation analog signal to provide a second analog signal to an input of a first device in the receiver.

7. The leakage compensation circuit of claim 6, wherein the first device is one of an analog to digital converter (ADC) in the receiver or a low-noise amplifier (LNA) in the receiver.

8. The leakage compensation circuit of claim 1, wherein the compensation analog signal is used to remove direct current (DC) offsets in the receiver.

9. A leakage compensation system, comprising:
   a compensation digital to analog converter (DAC) configured to:
     receive a compensation digital signal based on a transmission digital signal from a transmitter of a transceiver, wherein the transmission digital signal is provided to a transmitter DAC of the transmitter;
     generate a compensation analog signal using the compensation digital signal; and
     provide the compensation analog signal to adjust a first input signal of an analog to digital converter (ADC) of a receiver of the transceiver.

10. The leakage compensation system of claim 9, further comprising:
   a combiner circuit configured to adjust the first input signal with the compensation analog signal and provide the adjusted first input signal to the ADC.

11. The leakage compensation system of claim 9, wherein the compensation DAC, the transmitter DAC, and the ADC are located in a same integrated circuit (IC).

12. The leakage compensation system of claim 9, further comprising:
   an adjustment circuit configured to:
     generate the compensation digital signal by adjusting the transmission digital signal from the transmitter based on one or more adjustment parameters.

13. The leakage compensation system of claim 12, wherein the adjustment circuit includes an amplitude scaling circuit configured to:
   adjust an amplitude of the transmission digital signal based on an amplitude scaling parameter of the adjustment parameters such that an amplitude of the compensation digital signal is aligned with an amplitude of a transmitter leakage signal of the first input signal.

14. The leakage compensation system of claim 12, wherein the adjustment circuit includes a phase alignment circuit configured to:
   adjust a phase of the transmission digital signal based on a phase alignment parameter of the adjustment parameters such that a phase of the compensation digital signal is aligned with a phase of a transmitter leakage signal of the first input signal.

15. The leakage compensation system of claim 12, further comprising:
   a control circuit configured to perform a calibration process to determine values of the one or more adjustment parameters.

16. The leakage compensation system of claim 12, further comprising:
   a control circuit configured to:
     update the one or more adjustment parameters based on a feedback signal from the receiver.

17. A method, comprising:
   receiving, by a compensation digital to analog converter (DAC) a compensation digital signal based on a transmission digital signal from a transmitter of a transceiver,
     wherein the transmission digital signal is provided to a transmitter DAC of the transmitter;
   generating a compensation analog signal using the compensation digital signal; and
   providing the compensation analog signal to adjust a first input signal of an analog to digital converter (ADC) of a receiver of the transceiver.

18. The method of claim 17, further comprising:
   generating the compensation digital signal by adjusting the transmission digital signal from the transmitter based on one or more adjustment parameters.

19. The method of claim 18, wherein the generating the compensation digital signal includes:
   adjusting an amplitude of the transmission digital signal using an amplitude scaling parameter of the adjustment parameters such that an amplitude of the compensation digital signal is aligned with an amplitude of a transmitter leakage signal of the first input signal.

20. The method of claim 18, wherein the generating the compensation digital signal includes:
   adjusting a phase of the transmission digital signal based on a phase alignment parameter of the adjustment parameters such that a phase of the compensation digital signal is aligned with a phase of a transmitter leakage signal of the first input signal.

* * * * *